United States Patent [19]

Wolski et al.

[11] Patent Number: 5,207,889

[45] Date of Patent: May 4, 1993

[54] METHOD OF PRODUCING TREATED COPPER FOIL, PRODUCTS THEREOF AND ELECTROLYTE USEFUL IN SUCH METHOD

[75] Inventors: Adam M. Wolski, Edgewater Park, N.J.; Laurette M. Maguet, Le Moulin, Luxembourg; Michel Streel, Mabompre, Belgium

[73] Assignee: Circuit Foil USA, Inc., Bordentown, N.J.

[21] Appl. No.: 641,922

[22] Filed: Jan. 16, 1991

[51] Int. Cl.⁵ .......................... C25D 3/58; C25D 7/06
[52] U.S. Cl. ..................................... 205/155; 205/240
[58] Field of Search ................................ 305/155, 240

[56] References Cited

U.S. PATENT DOCUMENTS 3,857,681 12/1974 Yates et al. ............................ 428/554
4,572,768 2/1986 Wolski et al. ........................... 204/15

*Primary Examiner*—T. M. Tufariello
*Attorney, Agent, or Firm*—Finnegan, Henderson, Farabow, Garrett & Dunner

[57] ABSTRACT

An improved treatment for copper foil comprising electrodepositing a metallic barrier layer of copper, zinc and antimony on at least one side of the foil which, preferably, has a matte surface formed prior to forming the barrier layer. The so-treated foil provides a high bonding strength when laminated to polymeric substrates and resists undercutting by mineral acid etchants and rinses during production of printed circuit boards.

12 Claims, No Drawings

METHOD OF PRODUCING TREATED COPPER FOIL, PRODUCTS THEREOF AND ELECTROLYTE USEFUL IN SUCH METHOD

FIELD OF THE INVENTION

This invention relates to the treatment of copper foil to be laminated to a polymeric substrate and used in producing printed circuits and, more particularly, to such a treatment which enhances laminate bonding and resistance to undercutting. This invention also relates to treated copper foil, copper-clad laminates made with such foil, and a novel electrolyte for use in such treatment.

BACKGROUND OF THE INVENTION

Heretofore, various methods have been developed for improving the bond strength of copper foil bonded by an adhesive to an insulating synthetic polymer substrate so as to form a laminate for use in the production of printed circuit boards. Also, methods have been developed for reducing undesirable laminate staining, or discoloration, believed to be caused by chemical reactions between the copper and acid components of the resin used to form the substrate. For example, U.S. Pat. No. 3,857,681 discloses that the above-indicated problems are resolved by treating the copper foil so as to produce a matte surface formed of a plurality of copper electrodeposits having certain defined characteristics and subsequently coating the matte surface with a thin layer of a metal which is substantially chemically inert to the substrate, for example, zinc which, when heated, will form a brassy layer with the underlying copper.

As disclosed in U.S. Pat. No. 4,572,768, however, there is one other threat to the quality of a printed circuit that results from processes used in its manufacture. This is undercutting, which is the removal during etching of the material under some or all of the foil that is protected by the photoresist that is applied to define the printed circuit. Removal of copper under the photoresist weakens bonding of the copper to the board. In extreme cases of undercutting, portions of the printed circuit may even become detached from the board. It was therefore found necessary that the treated foil be able to withstand the etchant sufficiently to produce an acceptably low degree of undercutting.

This latter patent discloses that the above and other problems can be overcome by a treatment for copper foil that is to be used for lamination to a board comprises, as disclosed in the first above patent, electrodepositing a dendritic layer of copper on the side of the foil that is to be laminated to the board and securing the dendritic layer by electrodepositing a gliding layer of copper over it. A barrier layer of a material which is substantially inert to the substrate is then electrodeposited over the gliding layer. The barrier layer is formed by means such as electrodeposition from a solution containing ions of zinc, nickel and antimony. The resulting nickel-zinc-antimony barrier layer improves the resistance to undercutting.

With the advent of miniaturization, very densely packed printed circuit boards are needed. Miniaturization often requires that the copper foil conductors, or track lines, of today's printed circuit board be as narrow as 5 mils or less. Manufacturers of electrodeposited copper foil for the electronic industry must, therefore, produce foils having very special properties. For example, copper foil track lines have to be very firmly anchored to the substrate, which typically is made of a resin such as epoxy, polyimide, phenolic or another like polymer.

Typically, to aid in providing a strong bond, one or both sides of the foil which is to be bonded to the substrate is subjected to a bonding treatment of the above-described type to form a matte surface which improves the bonding, or initial peel strength, between the foil and the substrate to which it is laminated. As referred to above, a barrier layer, usually composed of zinc or brass, is applied by electrodeposition to the matte surface of the foil, i.e., the outer layer which results from the above bonding treatment. This barrier layer prevents direct contact between the metallic copper and the resin of the substrate and mitigates laminate staining. Since the temperature of lamination is quite high and the duration of the process is long, e.g., 350° F. for about one hour in the case of production of epoxy laminates, zinc atoms of the barrier layer tend to readily migrate into the copper matrix of the foil, and there is also a migration of copper atoms from the foil into the barrier layer. Thus, there is formed on the foil a layer of "thermal brass" having a zinc concentration which varies across its thickness.

It is the practice in manufacturing printed circuit boards from copper-clad laminate to form the image of the desired printed circuit pattern on the copper surface of the laminate by a photographic technique which leaves the desired pattern formed of a photoresist material on the surface of the copper. The photoresist material protects the underlying copper from an etching solution, usually a concentrated solution of cupric chloride and hydrochloric acid, used to remove copper foil from the unwanted areas. Following the etching, the boards are usually rinsed in a 10% solution of hydrochloric acid and then rinsed in water.

It will be appreciated that the above acidic solutions will act laterally, as well as perpendicularly, in dissolving the copper cladding. Since the brass barrier layer is more readily dissolved by the mineral acids than the copper, those lateral portions of the copper foil track lines immediately adjacent the substrate tend to be dissolved, so that the track lines are "undercut," which reduces the surface area of the copper foil bonded to the substrate. Consequently, the initial peel strength, or bonding strength, of the copper foil track line to the substrate is reduced.

Our tests conducted using 1 millimeter (mm) wide track lines showed a reduction of, for example, about 20% in the initial peel strength of copper clad laminates. This means that approximately 10% of the peel strength was lost on each side of the track line. Since 1 mm approximates 40 mils, this means that the width of the bonded area of the copper-polymer interface was reduced by 4 mils on each side of the track line. Therefore, in today's densely packed printed circuit boards using, e.g., 5 mil track lines, the track lines would become unanchored, or simply lifted from the polymeric substrate.

In view of the foregoing, it has become apparent to us that in order to supply the highest quality copper foil, especially foil suitable for densely packed printed circuit boards, the foil must have an improved ability to resist undercutting by the etching solution, and particularly by the hydrochloric acid.

While the methods disclosed in U.S. Pat. Nos. 3,857,681 and 4,572,768 provided significant advances in improving the quality of copper foil for use in printed circuit boards, still higher quality copper foil is required to meet the present day requirements. Even though the nickel-zinc-antimony barrier layer disclosed in U.S. Pat. No. 4,572,768 resists undercutting more than other types of barrier layers, still greater resistance to undercutting is required in order to meet present day requirements for copper foil, while at the same time providing a foil having good bonding characteristics and resistance to laminate staining.

SUMMARY OF THE INVENTION

It is an object of the present invention to provide an improved treatment for copper foil.

It is a further object of the present invention to provide a treatment for copper foil for use in printed circuit boards, especially densely packed printed circuit boards, that reduces undercutting of the foil and enables a higher peel strength to be obtained after etching.

Still a further object of the present invention is a treatment for copper foil that produces an improved barrier layer on at least one side of the foil.

Additional objects of the present invention are improved quality treated copper foil, improved quality copper-clad laminates, and an electrolyte useful to the treatment of copper foil.

Other objects of the present invention will become apparent from the following description of the invention and from the practice of the invention.

To achieve the foregoing objects and in accordance with the purpose of the invention, as embodied and broadly described herein, there is provided a method of treating copper foil comprising forming on at least one side thereof a metallic barrier layer comprising copper, zinc, and antimony.

Preferably, the above barrier layer is formed on a matte surface which is formed on the matte side of the copper foil by electrodeposition, and most preferably the matte surface is formed by electrodepositing on the surface of the foil a plurality of separate copper layers, each having different physical characteristics. The first such treatment layer is a nodular powdery copper layer applied directly on the matte side of the raw foil, and the second treatment layer is a locking or gilding copper layer which is not nodular in structure but which conforms to the configuration of the first layer after being electrodeposited thereon.

The present invention also provides a copper foil having on at least one side thereof an electrodeposited metallic barrier layer comprising by weight, about 65–80% copper, about 20–30% zinc and about 2–5% antimony, and, preferably such barrier layer is formed on an electrodeposited copper matte surface which is formed on a raw foil surface.

The present invention further provides a laminate comprising a polymeric resin insulating substrate having bonded thereto copper foil, the copper foil having on its bonding side a copper-zinc-antimony barrier in direct contact with the substrate.

The present invention also provides an electrolyte for use in the aforementioned treatment which comprises an aqueous solution comprising: copper sulfate; zinc sulfate; potassium pyrophosphate; potassiumsodium tartrate; and antimony potassium tartrate.

DESCRIPTION OF THE PREFERRED EMBODIMENTS

The production of copper foil for electronic applications, e.g., copper-clad laminate for printed circuit boards, involves the use of a well-known electrodeposition process. This process utilizes a large cylindrical drum cathode which rotates, partially immersed in a copper sulfate-sulfuric acid electrolyte. The drum cathode is adjacent to and facing toward a pair of curved anodes, which may be formed of lead, lead-antimony, platinized titanium, iridium or ruthenium oxides. Both the drum and the anodes are connected electrically by heavy buss-bars to a D.C. power source and currents of up to 50,000 amps or more are commonly used. As the drum rotates in the electrolyte, an electrodeposit of copper forms on the drum surface, and as the latter leaves the electrolyte, the electrodeposited copper is continuously stripped from the rotating drum in the form of thin foil, which is slit to size and wrapped around a take-up roll. The top surface of the drum is usually formed of stainless steel, titanium or chromium.

Foil produced in such a process, prior to being treated, is usually referred to as raw foil. The raw foil is pale pink in color and has two distinctly different looking sides—a shiny side, the side which was plated onto the drum surface and then stripped is quite smooth while the other side, the side which was facing toward the electrolyte and the anodes, is referred to as the matte side since it has a velvety finish. The matte side can be imagined as a set of closely packed cones having heights of from five to ten microns, the cone heights depending upon the independent variables of foil thickness, current density, solution composition, and the like. This provides the basic shape of the foil surface for embedding in the resin of a substrate to promote adhesion in the copper clad laminate.

While the matte side of the foil has a certain microroughness, a surface treatment is applied to the matte side of the raw foil to insure adequate bonding strength after the copper-clad laminate is formed. "Treatment" is the term universally used to refer to changing one or both surfaces of the electroformed foil to make it suitable for bonding to laminate resins.

The treatment operation is conducted in machines called "treaters" wherein rolls of raw foil are unrolled in a continuous manner and fed into the treater by means of driven rollers (similar to the way in which a web of paper is handled in a printing machine), rendered cathodic by means of contact rollers and passes in a serpentine fashion through one or more plating tanks, facing, in each tank, a rectangular anode. Each tank has its own supply of appropriate electrolyte and its D.C. power source. Between the tanks, the foil is thoroughly rinsed on both sides. The purpose of this operation is to electrodeposit on at least one side of the foil, usually the matte side, micro-projections of complex shape which ensure that the foil will be firmly anchored to the base polymeric materials used in fabricating the copper clad laminates.

The present invention involves the treatment of copper foil to provide excellent bonding strength, resistance to staining, and resistance to undercutting during etching. Although the present invention can be practiced using mechanically produced copper foil, it is preferred to use electrolytically deposited copper foil since it tends to provide a significantly greater bonding strength between the foil and the resinous substrate.

In accordance with the present invention, copper foil, preferably electrolytically deposited copper foil, is subjected to a first treatment step which will effectively serve to roughen at least one of its surfaces, preferably the matte side of the foil, so as to provide on such surface a matte surface which enhances the bonding characteristics over the untreated foil. This first treatment step comprises the application to the foil of at least two separate electrodeposited copper treatment layers, each succeeding electrodeposited layer having a different mechanical structure from the preceding electrodeposited layer to present a treated surface having physical properties different from those of the latter. In other words, this treatment involves a plurality of electrolytic copper treating operations carried out in a plurality of treating tanks, each one being carried out under separate electroplating conditions. The first operation involves the application to the copper foil of a nodular powdery electrodeposited copper layer which is coarse and rough and weakly adherent to the base copper foil, followed by a second operation involving the application of an electrodeposited locking or gilding copper layer which is not nodular in structure but which conforms to the configuration of the first layer. These steps are well-known and are disclosed in U.S. Pat. No. 3,857,681, entitled "Copper Foil Treatment and Products Produced Therefrom," U.S. Pat. No. 3,918,926 entitled "Plural Copper Layer Treatment of Copper Foil and Articles Made Thereby," and its reissue, U.S. Pat. No. Re. 30180, and also U.S. Pat. No. 4,572,768 entitled "Treatment for Copper Foil." The disclosures of all of these patents are incorporated herein by reference and form a part of this application as if annexed hereto.

Following the above two-step treatment, the foil is then treated to form a barrier layer directly on the gilding copper layer. First, however, before applying the barrier layer, the treated surface should be thoroughly washed so as to completely remove any residue, for example, sulfuric acid, therefrom, which would otherwise prevent the metals forming the barrier layer from plating properly on the surface of the copper. The treated and washed copper foil is then passed through a plating bath comprising an electrolyte containing ions of copper, zinc, and antimony, and a metallic barrier layer comprising copper, zinc, and antimony is electrodeposited on the matte surface of the copper foil so as to completely cover the surface. The electrodeposited metals will be deposited in a layer of 0.3–3, and preferably 1, grams per square meter of foil surface. Any conventional means for electrodepositing the copper, zinc, and antimony may be used to form the barrier layer, although, while less effective, other methods of application of the metal coating may be employed such as vapor deposition.

In the preferred embodiment, the treated copper foil is passed through a plating bath comprising an electrolyte which is an aqueous solution containing copper sulfate, zinc sulfate, potassium pyrophosphate, potassium sodium tartrate and antimony potassium tartrate. The pH of the electrolyte is preferably in the range of 8–9. During electroplating, the electroplating bath is maintained a a temperature in a range of about 40°–60° C. and a current density in the range of about 3–10 amperes per square decimeter (A/DCM$^2$) of direct current is employed.

It is preferred that the following novel electrolyte be employed in electroplating the copper, zinc, and antimony to form the barrier layer.

TABLE 1

| | |
|---|---|
| copper sulfate | 25–100 grams per liter |
| zinc sulfate | 6–24 grams per liter |
| potassium pyrophosphate | 100–350 grams per liter |
| potassium sodium tartrate | 10–50 grams per liter |
| antimony potassium tartrate | 0.5–5 grams per liter |
| water | balance |

The above described electrolyte, when used under the foregoing conditions, is capable of electrodepositing on the matte surface of the copper foil a uniform metallic layer of a ternary alloy comprising, by weight, 60–80% copper, 20–35% zinc, and 2–5% antimony. This forms a barrier layer which has been observed to be completely resistant to undercutting by the most popular etchant used in the printed circuit board industry, a concentrated solution of cupric chloride and hydrochloric acid, as well as by a 10% solution of hydrochloric acid which is generally used for rinsing the boards after etching. An advantage of this electrolyte is that it enables complex ions to be formed in the solution. Complex copper ions are formed in the electrolyte and the electrode potentials of the copper and zinc ions in the electrolyte are brought closer together, enabling a copper-zinc-antimony layer of uniform composition to be electrodeposited on the copper foil. This electrolyte has an additional advantage of being non-toxic, as compared to known and popular brass plating electrolytes based upon cyanide compounds of copper and zinc.

When subjected to heat, an electrodeposited zinc barrier layer interdiffuses with the underlying copper so as to produce a copper-zinc alloy the composition of which, at the exposed surface, varies with the composition of the barrier layer deposited on the copper foil, the temperature encountered and the length of time exposed to this temperature. For example, the zinc in the barrier layer migrates into the copper foil and the copper in the foil migrates into the barrier layer. Thus, a concentration gradient tends to exist from the surface of the barrier layer into the copper foil, and can, from the surface of the barrier layer inward, cover a variety of brasses, as designated by their Cu/Zn ratios. The corrosion properties of copper-zinc alloys vary, and as the zinc content increases, the alloy becomes more subject to dezincification and corrosion by the above etchant and rinsing solution. While alloying with antimony provides resistance to dezincification and corrosion inhibition, the presence of antimony, in itself, does not provide satisfactory resistance to undercutting in a copper foil which has been treated by conventional techniques.

Surprisingly, we have now found that the resistance to undercutting can be increased remarkably by applying to the copper foil a metallic barrier layer comprising copper, zinc, and antimony and that the as-deposited electrodeposited barrier layer containing, by weight, about 65–80% copper, about 20–35% zinc, and about 2–5% antimony treated foil, is completely resistant to undercutting by cupric chloride-hydrochloric acid etchants and by hydrochloric acid solutions used in rinsing copper clad laminates.

With previous fused zinc barrier layers, heating was required to bring copper to the surface of the barrier layer. With the previous brass barrier layer, heating was not required, but the brass was subject to undercutting.

In accordance with the present invention, however, it is not necessary for the foil manufacturer to subject the treated foil to heating, due to its copper content. Since the barrier layer of the present invention has a uniform composition across its thickness, it is more resistant to corrosion by the etchant and rinse acids.

If, however, it is desired to heat the treated foil of the present invention, the heating temperature should not be greatly in excess of about 400° F., since the shiny side of the foil may oxidize. In addition, such higher temperature may cause recrystallization of the copper, resulting in a loss of properties such as hardness, ductility, etc., which are important to printed circuit applications.

As previously mentioned, it is within the contemplation of the present invention not only to provide a novel method for producing copper foil having good bond strength after etching and not subject to laminate staining in printed circuit applications and copper foil produced thereby, but also to provide laminates comprised of such copper foil bonded to an appropriate substrate. As will be apparent, the particular substrate used in this laminate will vary depending upon the use for which the laminate is intended and the service conditions under which such laminate will be used. Particularly appropriate substrates which adapt the laminate for use in forming printed circuits include non-flexible supports such as Teflon-impregnated fiberglass ("Teflon" is a trademark for polytetrafluoroethylene), Kel-F impregnated fiberglass ("Kel-F" is a trademark for certain fluorocarbon products including polymers of trifluorochlorethylene and certain copolymers) and the like. Suitable flexible substrates include polyimides such as those known under the designations "Kapton" and "H-Film" (both are manufactured by E. I. duPont de Nemours & Company and are polyimide resins produced by condensing a pyromellitic anhydride with an aromatic diamine).

The adhesives used to bond the treated copper foil to the substrate are those conventionally used for the specific application in question, "FEP" (a fluorinated ethylene propylene resin in the form of a copolymer of tetrafluoroethylene and hexafluoropropylene having properties similar to Teflon) being particularly appropriate for the Teflon and Kel-F and conventional epoxy resins being useful for the other materials. The method of bonding the copper foil to the substrate is conventional and forms no part of the present invention, typical details of such bonding being set forth for example in the U.S. Pat. No. 3,328,275 to Waterbury.

The following examples and comparative examples further illustrate preferred operations within the scope of the present invention and the advantages of the present invention as compared to prior art treatments.

COMPARATIVE EXAMPLE I

A one ounce copper foil was treated by electroplating on the matte side thereof a dendritic layer and a gilding layer of copper to form a matte surface, as described in U.S. Pat. No. 4,572,768. Next, a copper-zinc barrier layer was electroplated onto the matte surface. The electroplating was conducted using an electrolyte consisting of water, 25 grams per liter copper sulfate, 6 grams per liter zinc sulfate, 110 grams per liter potassium pyrophosphate, and 50 grams per liter potassium sodium tartrate. The pH of the electrolyte was 8.7. The electroplating was conducted at a temperature of 45° C., using a current density of $7A/DCM^2$ and a plating time of fourteen seconds. A yellow colored brass layer, consisting of copper and zinc, was formed on the copper foil.

COMPARATIVE EXAMPLE II

A one ounce copper foil provided with a matter surface, as in Comparative Example I, was electroplated to form a nickel-zinc-antimony barrier layer on the matte surface. The electroplating was conducted using as an electrolyte an aqueous solution containing 50 grams per liter of zinc sulfate, 2.5 grams per liter of nickel sulfate, and antimony as potassium antimony tartrate at a concentration of 800 parts per million. The temperature of the plating solution was maintained at approximately 27° C. and the pH of the solution was maintained at approximately 2.0 by the addition of zinc oxide or sulfuric acid. The plating time was about 10 seconds. The copper foil was coated with a nickel-zinc-antimony layer having a dark gray color.

EXAMPLE I

Copper foil was electroplated using the electroplating conditions and an electrolyte of Comparative Example I, except that 1 gram per liter of antimony potassium tartrate wa added to the electrolyte and thoroughly dissolved. When the electroplating was repeated under the same conditions as above, the copper foil was coated with a darker yellow layer of antimonial brass.

Each of the treated foils of Comparative Examples I and II and Example I was then subjected to the following undercutting test.

Samples of the treated foils produced as described above were tested for various properties. Each of the test specimens was bonded to a prepreg of glass fiber and epoxy resin, designated FR4 by the National Electrical Manufacturers, Association (NEMA). Resistance to undercutting was tested by applying strips of 1 mm wide acid resistant tape on the foil of the resulting laminate and etching the laminated foil in cupric chloride to produce two lines of bonded copper, each 1 mm wide. One of the lines was pulled from the prepreg by a force that was measured. The remaining line was subjected to a bath of 1:1 hydrochloric acid at room temperature for one hour, then pulled from the prepreg. The difference in the measured forces provided an indication of how the foil resisted undercutting. Measured results of Comparative Examples I and II and of Example I on FR-4 are given in the table.

TABLE

|  | Before HCL | After HCL | % Loss | % Loss Calculated For 5 mils Width |
|---|---|---|---|---|
| Copper-Zinc | 0.50 | 0.47 | 6% | 48% |
| Nickel-Zinc-Antimony | 0.50 | 0.49 | 2% | 16% |
| Copper-Zinc-Antimony | 0.51 | 0.51 | 0 | 0 |

For the above test a 1 mm width of copper foil was chosen, because this is the narrowest strip of copper foil which can be conveniently handled (pulled off the polymer surface while measuring and recording the necessary force). Since 1 mm equals 40 mils, a 5 mil track line is eight times narrower than 1 mm, and the width of the attack by HCL would be the same as on 1 mm lines. Therefore, as seen from the above table, the calculated peel strength loss for the narrower track lines having barrier layers of copper-zinc and nickel-copper-antimony would be in the order of 48% and 16%, respectively, which is a very serious problem for manufacturers of printed circuit boards.

As shown in the above table, the copper foil having the copper-zinc-antimony barrier layer of the present invention was found to have a peel strength of 0.51 pounds both before and after the HCL bath, demonstrating that the barrier layer of the present invention completely resisted undercutting and provides a peel strength superior to copper foil having the other types of barrier layers.

Having described preferred embodiments of the present invention it should be recognized that variations and modifications thereof falling within the spirit of the invention may become apparent to those skilled in this art, and the scope of our invention is to be determined by the appended claims and their equivalents.

What is claimed is:

1. A method of treating copper foil comprising forming on at least one side thereof an electrodeposited metallic barrier layer comprising about 65-80 weight % copper, about 20-35 weight % zinc and about 2-5 weight % antimony.

2. The method of claim 1, wherein said side of said foil is provided with a matte surface formed on a raw surface of said foil by electrodeposition of copper prior to forming said barrier layer.

3. The method of claim 2, wherein said matte surface is formed by electrodepositing on said foil a plurality of copper layers each having different physical characteristics.

4. The method of claim 2, wherein said barrier layer is electrodeposited from an electrolyte solution which comprises: copper sulfate; zinc sulfate; potassium pyrophosphate; potassium; sodium tartrate; and antimony potassium tartrate.

5. The method of claim 4, wherein said copper, zinc and antimony are electrodeposited onto said side of said foil using direct current at a current density of from about 3-10 amperes per square meter, said electrolyte is maintained at a temperature of from about 40°-60° C. and said electrolyte comprises the following ingredients in the indicated amounts:

| copper sulfate | 25-100 grams per liter |
|---|---|
| zinc sulfate | 6-24 grams per liter |
| potassium pyrophosphate | 100-350 grams per liter |
| potassium, sodium tartrate | 10-50 grams per liter |
| antimony potassium tartrate | 0.5-5 grams per liter. |

6. Copper foil produced by the method of claim 1.

7. The copper foil of claim 6, wherein said side of said foil is provided with an electrodeposited copper matte surface and said barrier layer is electrodeposited on said matte surface.

8. The copper foil of claim 7, wherein said matte surface comprises a plurality of electrodeposited copper layers each having different physical characteristics.

9. A laminate comprising the copper foil of claim 6 and a supporting resinous substrate, the barrier layer comprising copper, zinc, and antimony being bonded to said substrate.

10. The copper foil of claim 6, wherein said barrier layer is a uniform metallic layer of a ternary alloy of said copper, zinc and antimony.

11. The copper foil of claim 6, wherein said barrier layer is deposited in a layer of from 0.3 to 3 grams per square meter of foil surface.

12. An electrolyte comprising an aqueous solution of the following ingredients in the indicated amounts:

| copper sulfate | 25-100 grams per liter |
|---|---|
| zinc sulfate | 6-24 grams per liter |
| potassium pyrophosphate | 100-350 grams per liter |
| potassium, sodium tartrate | 10-50 grams per liter |
| antimony potassium tartrate | 0.5-5 grams per liter | and having a pH of about 8-9.

* * * * *